United States Patent
Freydl et al.

(10) Patent No.: US 9,288,911 B2
(45) Date of Patent: Mar. 15, 2016

(54) METHOD AND COMPOSITE ASSEMBLY FOR PROCESSING OR TREATING A PLURALITY OF PRINTED CIRCUIT BOARDS AND USE THEREFOR

(75) Inventors: Gerhard Freydl, Leoben (AT); Christian Vockenberger, Leoben (AT)

(73) Assignee: AT&S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 425 days.

(21) Appl. No.: 13/635,328
(22) PCT Filed: Mar. 10, 2011
(86) PCT No.: PCT/AT2011/000120
§ 371 (c)(1),
(2), (4) Date: Sep. 14, 2012
(87) PCT Pub. No.: WO2011/113073
PCT Pub. Date: Sep. 22, 2011

(65) Prior Publication Data
US 2013/0003325 A1 Jan. 3, 2013

(30) Foreign Application Priority Data
Mar. 16, 2010 (AT) .................. GM168/2010

(51) Int. Cl.
*H05K 3/00* (2006.01)
(52) U.S. Cl.
CPC .... *H05K 3/0097* (2013.01); *H05K 2201/10598* (2013.01); *H05K 2203/0165* (2013.01); *H05K 2203/0169* (2013.01); *Y10T 29/49126* (2015.01)
(58) Field of Classification Search
CPC ......... H05K 3/00; H05K 3/0008; H05K 3/36; H05K 3/0097; H05K 13/00; H05K 13/02; H05K 13/0052; H05K 13/0069; H05K 2203/0165
USPC ............... 174/255; 29/701, 720, 721, 407.01, 29/407, 5
See application file for complete search history.

(56) References Cited

U.S. PATENT DOCUMENTS

| | | | |
|---|---|---|---|
| 4,030,717 A | 6/1977 | Serlovsky |
| 4,689,103 A | 8/1987 | Elarde |

(Continued)

FOREIGN PATENT DOCUMENTS

| | | |
|---|---|---|
| DE | 3113031 | 10/1982 |
| DE | 19600928 | 7/1997 |

(Continued)

OTHER PUBLICATIONS

Chinese Office Action of Oct. 31, 2014 issued to the corresponding Chinese patent application.

(Continued)

*Primary Examiner* — Anthony Haughton
*Assistant Examiner* — Matt Dhillon
(74) *Attorney, Agent, or Firm* — Jacobson Holman, PLLC.

(57) ABSTRACT

In a method for processing a plurality of printed circuit boards, comprising the following steps:
 providing a plurality of printed circuit boards,
 providing at least one frame element, for coupling to a plurality of printed circuit boards,
 coupling or the printed circuit boards to the at least one frame element,
 processing the printed circuit boards in the state coupled to the frame element,
it is provided that printed circuit boards of different sizes and/or thicknesses and/or of different constructions are coupled to the at least one frame element to form a composite assembly and are subjected to further processing in the composite assembly formed by the printed circuit boards and the at least one frame element. Furthermore, a composite assembly for processing a plurality of printed circuit boards and also a use of such a method and composite assembly are provided.

22 Claims, 2 Drawing Sheets

(56) References Cited

U.S. PATENT DOCUMENTS

Figure 1:
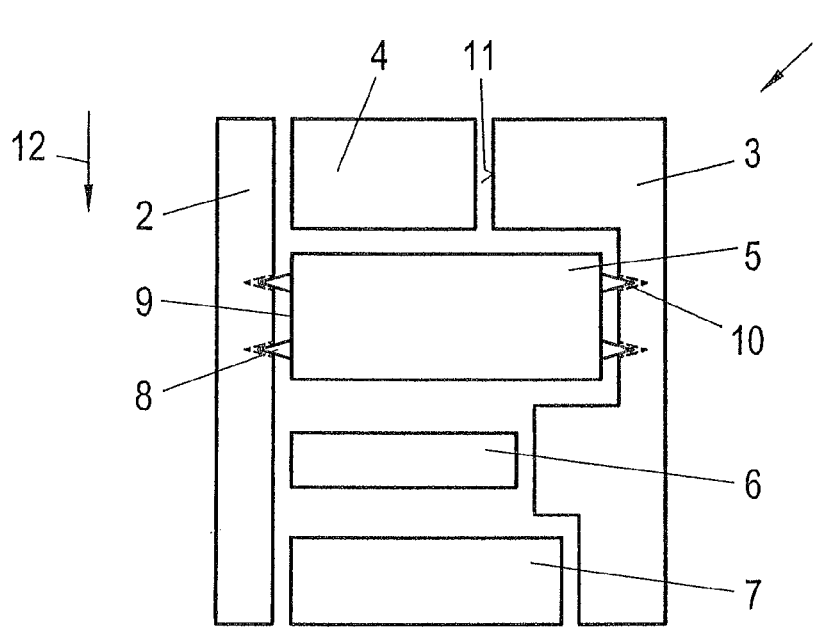

| | | | |
|---|---|---|---|
| 5,016,138 A * | 5/1991 | Woodman | H01L 23/5385 174/252 |
| 5,027,505 A * | 7/1991 | Nakamura | G09F 3/00 174/520 |
| 5,044,615 A | 9/1991 | Newman | |
| 5,208,729 A * | 5/1993 | Cipolla | H01L 23/467 165/80.3 |
| 6,035,525 A * | 3/2000 | Benz | H05K 3/0097 29/832 |
| 6,226,864 B1 * | 5/2001 | Muziol | H05K 3/4015 228/246 |
| 6,338,194 B1 * | 1/2002 | Benz | H05K 3/0097 29/830 |
| 7,430,798 B2 * | 10/2008 | Koizumi | B25B 27/14 29/740 |
| 7,451,768 B2 * | 11/2008 | Ku | H05K 3/0097 29/407.01 |
| 7,752,745 B2 * | 7/2010 | Higuchi | B26D 3/08 29/412 |
| 8,188,503 B2 * | 5/2012 | Lynch | G06F 1/189 257/99 |
| 2009/0014205 A1 | 1/2009 | Kobayashi | |
| 2012/0061716 A1 * | 3/2012 | Yu | H01L 33/486 257/99 |

FOREIGN PATENT DOCUMENTS

| | | |
|---|---|---|
| JP | 2007-258532 A | 10/2007 |
| WO | 2009/068741 | 6/2009 |

OTHER PUBLICATIONS

Chinese Office Action of Jul. 22, 2015 issued to the corresponding Chinese patent application.

\* cited by examiner

METHOD AND COMPOSITE ASSEMBLY FOR PROCESSING OR TREATING A PLURALITY OF PRINTED CIRCUIT BOARDS AND USE THEREFOR

This is a national stage of PCT/AT11/000120 filed Mar. 10, 2011 and published in German, which has a priority of Austria no. GM 168/2010 filed Mar. 16, 2010, hereby incorporated by reference.

FIELD OF THE INVENTION

The present invention relates to a method for processing or treating a plurality of printed circuit boards, comprising the steps of:
  providing a plurality of printed circuit boards,
  providing at least one frame or carrier element for coupling to a plurality of printed circuit boards,
  coupling or connecting the printed circuit boards to the at least one frame or carrier element,
  processing or treating the printed circuit boards in the state coupled to the frame or carrier element.

The invention, moreover, relates to a composite assembly for processing or treating a plurality of printed circuit boards, including at least one frame or carrier element for coupling to a plurality of printed circuit boards, said composite assembly, in the coupled state of the printed circuit boards, together with the at least one frame or carrier element being capable of being fed to the processing or treating of the printed circuit boards, and the use of such a method and composite assembly.

PRIOR ART

In the context of the production of printed circuit boards, it is known to produce a plurality of printed circuit boards or printed circuit board elements on a common plate-shaped element, such printed circuit boards, as a rule, each comprising a plurality of conducting and insulating layers and/or components integrated in such a printed circuit board. According to those known production methods, the substantially full-area mounting of a plurality of circuit boards on the common plate-shaped element is effected, whereupon, after completion of the circuit boards, the latter are separated from one another. In those cases, each of the circuit boards has a respective edge region about its periphery, and hence outside a substantially central region forming an actual circuit board element, in which central region the structures for mounting the circuit board and/or electronic components are integrated. Said edge region, for instance, is provided for carrying out further circuit board processing steps such as, for instance, in the context of the placing of components to be fixed to at least one surface and/or the installation into an electric or electronic device, in order to enable the manipulation and, in particular, automatic seizure of such a circuit board during subsequent treating or processing steps. According to presently known process controls, it is thus to be anticipated that the peripheral region to be provided for the frame or edge region of the circuit board is likewise usually produced of the same materials and by the same processes as the printed circuit board. Such an edge or peripheral region, which is not required for the functioning of the circuit board bearing in mind the usually multilayered structure comprised of expensive materials, however, will result in elevated costs of such a printed circuit board. In the context of known production methods of printed circuit boards, it is, moreover, to be anticipated that regions or areas located between individual circuit board elements, of the common plate-shaped element will be discarded as waste products such that elevated costs for the production of circuit boards or circuit board elements will also occur in this respect.

In connection with the production of printed circuit boards it is, for instance, further known to remove individual defective circuit boards from a common plate-shaped element if these have been recognized as defective in the course of tests or checks, and to replace such removed, defective printed circuit boards with individual printed circuit boards.

In addition, methods for collectively processing or treating and handling printed circuit boards of the initially defined kind are known, according to which several printed circuit boards or printed circuit board elements are usually inserted into carrier or frame elements each surrounding the printed circuit boards about their entire peripheries, and are fixed to them, for instance by gluing, in order to produce a composite assembly comprised of at least one frame or carrier element and a plurality of printed circuit boards. In this respect, it may, for instance, be referred to DE-A 196 00 928, U.S. Pat. No. 4,689,103 or U.S. Pat. No. 5,044,615. Those known methods for inserting printed circuit boards into a frame element each completely surrounding the printed circuit boards in order to produce a composite assembly to be jointly handled, in particular, involve the drawbacks that the reception openings to be provided in the frame element for placing the printed circuit boards have to be precisely adapted to the dimensions of the printed circuit boards to be inserted, and that a proper fixation, for instance by gluing to the peripheral edges of the printed circuit boards and frame elements usually having comparatively small thicknesses, is therefore extremely difficult and cumbersome.

The known embodiments, moreover, involve the drawback that only printed circuit boards having identical dimensions and/or shapes are each coupled to a frame or carrier element such that different frame and carrier elements are each employed for processing different printed circuit boards. The use of optionally at least partially automated processes will, therefore, be rendered difficult, in particular with small series or low piece numbers, thus increasing the expenditures involved in the respective exchange or adaptation required when treating or processing different printed circuit boards.

SUMMARY OF THE INVENTION

The present invention thus aims to further develop a method and composite assembly of the initially defined kinds in the context of processing or treating a plurality of printed circuit boards to the effect that the above-mentioned drawbacks will be avoided and a method and composite assembly largely renouncing cumbersome and expensive conversion operations when processing printed circuit boards of different sizes and/or shapes or dimensions will, in particular, be provided.

To solve these objects, a method of the initially defined kind is substantially characterized in that printed circuit boards of different sizes and/or thicknesses and/or different constructions are coupled to the at least one frame or carrier element to form a composite assembly and are subjected to further processing in the composite assembly formed by the printed circuit boards and the at least one frame or carrier element. In that printed circuit boards of different sizes and/or thicknesses and/or technologies and/or different constructions or, in general, different dimensions and/or shapes are coupled to the at least one frame or carrier element to form a composite assembly and said composite assembly is subsequently subjected to further processing of the printed circuit boards, cumbersome and expensive conversion operations of, in particular, the consecutive production or processing lines can be renounced even with small piece numbers or when changing between individual series of printed circuit boards. In doing so, different printed circuit boards that are assigned to a common component after processing, and/or different printed circuit boards that require differently high expenditures in further processing, according to the invention can, for instance, be coupled to at least one frame or carrier element as will be discussed in more detail below, which will result in considerable advantages, for instance, with regard to time and cost savings in the production and processing of such printed circuit boards, by enabling the achievement of a better workload or higher throughput of processing and assembly lines.

In order to enable simple handling of the different printed circuit boards respectively coupled to at least one frame or carrier element, in particular during a largely automated process, it is proposed according to a preferred embodiment that the configuration or design of the at least one frame or carrier element is selected as a function of the dimensions and/or design of the printed circuit boards to be processed or treated, in order to provide a composite assembly having substantially linear outer edges. When providing substantially linear outer edges of the composite assembly formed by the different printed circuit boards and the at least one frame or carrier element by the appropriate adaption of the configuration or design of the at least one frame or carrier element to the dimensions and/or designs of the different printed circuit boards, further processing or treating operations in a assembly line will thus be simplified in a manner substantially independent of the different printed circuit boards.

According to a preferred embodiment of the method according to the invention, it is proposed that the external dimension of the composite assembly is selected to be constant, in particular in a direction normal to a transport direction of the printed circuit boards to be processed or treated. It is thereby ensured that at least the dimensions in a passage direction through such a consecutively arranged processing line will be selected to be constant so as to enable the reduction or avoidance of adjustment or conversion operations of such a processing line at a change of, in particular, the sizes or dimensions of the printed circuit boards to be processed.

To enable a particularly simple adaptation and coupling or connection of the plurality of printed circuit boards to the frame or carrier elements for the production of the composite assembly to be handled subsequently, it is proposed according to a further preferred embodiment that a frame or carrier element is each provided on mutually opposite peripheral or edge regions of the composite assembly for coupling or connecting to a plurality of printed circuit boards.

To enable particularly simple and reliable coupling between the plurality of printed circuit boards and the at least one frame or carrier element for the production of the composite assembly to be handled subsequently, it is proposed according to a further preferred embodiment that coupling or connecting of the printed circuit boards to the at least one frame or carrier element is each effected by using at least one coupling element of a printed circuit board each matching at least one complementary coupling element of the at least one frame or carrier element.

To enable particularly simple and reliable handling or processing of the individual printed circuit boards during a subsequent treating or processing step, it is, moreover, proposed that a plurality of printed circuit boards are each connected to the at least one frame or carrier element in a mutually spaced-apart relationship, as in correspondence with a further preferred embodiment of the method according to the invention.

To further enhance the processing speed or throughput rate through a processing or treating line of such printed circuit boards, it is proposed according to a further preferred embodiment that coupling or connecting between the plurality of printed circuit boards and the at least one frame or carrier element is performed in an automated manner.

To ensure reliable coupling or connecting of the different printed circuit boards to the at least one frame or carrier element, it is proposed according to a further preferred embodiment that coupling or connecting between the plurality of printed circuit boards and the at least one frame or carrier element is performed by gluing mutually facing end faces of the frame or carrier element and the printed circuit board to be connected thereto. By using a gluing operation, a reliable connection will be achieved between the individual printed circuit boards and the at least one frame or carrier element, optionally by simultaneously using the additionally provided, complementary coupling elements. After all, such gluing operations are common in the context of processes for producing and processing printed circuit boards and thus, in particular, will not constitute additional expenditures or process steps in the context of the production of printed circuit boards or printed circuit board elements.

For a particularly reliable gluing operation to be optionally performed in an accordingly automated manner, it is proposed according to a further preferred embodiment that the adhesive is applied to at least one end face of at least one element to be connected, and the elements to be connected are subsequently connected by mutual joining or pressing. In this context, it is, moreover, proposed in a preferred manner that applying or introducing an adhesive into a gap between end faces of elements to be connected is accomplished using a dispensing means, a doctor blade, a screen-printing method or the like, as in correspondence with a further preferred embodiment of the method according to the invention.

In order to improve the throughput rate of a processing or assembly line, it is, moreover, preferably proposed according to the method of the invention that printed circuit boards calling for differently high processing expenditures in the course of subsequent processing operations are coupled or connected to at least one frame or carrier element. By forming a composite assembly from different printed circuit boards requiring differently high processing expenditures after the production of the composite assembly, the devices to be used for treating or processing can be used in an accordingly more uniform manner. As compared to process controls by which identical printed circuit boards optionally requiring different treating or processing operations are each processed, it will thus be possible to employ for the different printed circuit boards, in particular, different devices to be used for subsequent processing, which devices have been accordingly optimized and mutually tuned.

As already briefly pointed out above, further improvement in the production of printed circuit boards will be achieved in that printed circuit boards which, after processing, will be assigned to a common structural unit, or integrated or arranged in a common structural unit, are connected or coupled to at least one frame or carrier element, as in correspondence with a further preferred embodiment of the method according to the invention. It will thus, for instance, be possible according to the invention to provide kits comprising a plurality of different printed circuit boards or printed circuit board elements in, in particular, finished states of the printed circuit boards, which will, for instance, subsequently be used in a common component. By providing such a unit or composite assembly comprising at least one frame or carrier element and a plurality of different printed circuit boards, it will be possible to reduce both logistic and administrative expenditures when using or installing such printed circuit boards in electronic devices or components, in that a kit or composite assembly will, for instance, contain all printed circuit boards used in an electronic device or component, so that the construction or assemblage of such devices, in particular, will not require printed circuit boards to be provided from different sources involving accordingly increased expenditures.

The present method according to the invention, according to which printed circuit boards of different sizes and/or dimensions and/or for different purposes of use are coupled to at least one frame or carrier element to form a common assembly or kit, thus allows for a strong reduction of the expenditures involved in providing such different printed circuit boards for the subsequent incorporation of these printed circuit boards in a component or electronic device.

To solve the initially mentioned objects, a composite assembly of the initially defined kind for processing or treating a plurality of printed circuit boards is essentially characterized in that printed circuit boards of different sizes and/or thicknesses and/or different structures are coupled to the at least one frame or carrier element to form said composite assembly, and that the composite assembly formed by the printed circuit boards and the at least one frame or carrier element is capable of being subjected to further processing. As already pointed out above, it will thus be possible in a simple and reliable manner to form a composite assembly comprised of at least one frame or carrier element and a plurality of different printed circuit boards such that corresponding advantages in respect to both the throughput of, in particular automated, processing and assembly lines and the subsequent use of such finished printed circuit boards will be achieved.

In order to facilitate handling after the production of the composite assembly, it is proposed according to a preferred embodiment that the dimensions of the at least one frame or carrier element are selected as a function of the dimensions and/or design of the printed circuit boards to be processed or treated, in order to provide a composite assembly having substantially linear outer edges.

In order to further improve the throughput through subsequent processing lines, it is proposed according to a further preferred embodiment that the external dimension of the composite assembly is selected to be constant, in particular in a direction normal to a transport direction of the printed circuit boards to be processed or treated.

In order to enable particularly simple and reliable handling of the composite assembly comprised of a plurality of printed circuit boards and at least one frame or carrier element, in particular during a largely automated process, it is, moreover, proposed that a frame or carrier element is each provided on mutually opposite peripheral or edge regions of the composite assembly for coupling or connecting to a plurality of printed circuit boards, as in correspondence with a further preferred embodiment of the invention.

In order to enable particularly simple and reliable coupling for the production of the composite assembly according to the invention, it is proposed according to a further preferred embodiment that the at least one frame or carrier element comprises a plurality of coupling elements that are each capable of being coupled or connected to at least one complementary coupling element of a respective printed circuit board.

In order to simplify or facilitate subsequent treating and/or processing steps, it is, moreover, proposed that a plurality of printed circuit boards are each connected to the at least one frame or carrier element in a mutually spaced-apart relationship, as in correspondence with a further preferred embodiment of the invention.

In order to reduce costs and achieve additional material savings, it is proposed according to a further preferred embodiment that the at least one frame or carrier element is configured to be reusable.

In the context of reducing the costs involved in the production or processing of individual printed circuit boards, it is, moreover, proposed according to a further preferred embodiment that the at least one frame or carrier element is made of a material that is more cost-effective than the material used for the printed circuit boards.

In order to achieve a reliable connection or coupling between the different printed circuit boards and the at least one frame or carrier element, it is proposed according to a further preferred embodiment that the printed circuit boards and the at least one frame or carrier element are connectable by gluing.

In order to reduce the logistic expenditures involved in further mounting or when using printed circuit boards produced by the use of the composite assembly according to the invention, it is, moreover, proposed that printed circuit boards which, after processing, will be assigned to a common structural unit, or integrated or arranged in a common structural unit, are connected or coupled to at least one frame or carrier element, as in correspondence with a further preferred embodiment of the composite assembly according to the invention. As already indicated above, the supplying or logistic expenditures involved in the incorporation of different printed circuit boards into a component or electronic device will thus be strongly reduced.

In accordance with the invention, the use of the method and/or composite assembly according to the invention for the, in particular, automated assemblage, mounting etc. of printed circuit boards is applied, thus enabling the achievement of advantages in terms of cost savings relating to reduced time expenditures in the production due to, in particular, the greatest possible elimination of conversion times when processing different printed circuit boards, as already pointed out above several times. When using a composite assembly comprised of different printed circuit boards and at least one frame or carrier element, it is, moreover, possible to achieve advantages in view of a reduction of the logistic expenditures involved in the installation of such different printed circuit boards in a common component or in an electronic device.

SHORT DESCRIPTION OF THE DRAWINGS

In the following, the invention will be explained in more detail by way of exemplary embodiments schematically illustrated in the accompanying drawing. Therein, FIG. 1 is a schematic top view of a composite assembly according to the invention, which is comprised of a plurality of different printed circuit boards and two frame or carrier elements, said composite assembly having been produced by the method according to the invention; and FIGS. 2 to 7 are partially sectioned partial views of a connection of different printed circuit boards, or one printed circuit board each, to at least one frame or carrier element, with the elements to be connected partially having different thicknesses or, in general, different structures.

DETAILED DESCRIPTION OF PREFERRED EMBODIMENTS

In the illustration according to FIG. 1, a composite assembly is generally denoted by 1, wherein a plurality of respectively differently configured printed circuit boards or printed circuit board elements 4, 5, 6 and 7 are coupled or connected to frame or carrier elements 2 and 3 provided on the outer edges of the composite assembly 1.

Besides the connection of the printed circuit boards 4 to 7 with the frame or carrier elements 2 and 3 located on the outer peripheries, for instance by gluing as will be discussed in detail below especially with reference to FIGS. 2 to 7, additional coupling elements may be provided, which are denoted by 8 for the printed circuit board 5 represented in FIG. 1 and, for instance, are formed by substantially triangular protrusions projecting from a lateral edge or end face 9 of the printed circuit board 5. The coupling elements 8 cooperate with respective recesses or depressions provided in the frame or carrier elements 2 and 3 and schematically indicated in FIG. 1 by broken lines 10.

From FIG. 1, it is apparent that, besides a substantially linear configuration of the frame or carrier element 2, the carrier element 3, in particular, has an appropriately contoured design on its inner side facing the printed circuit boards 4 to 7, which contoured design is adapted to the different sizes or dimensions of the printed circuit boards 4 to 7 to be coupled or connected thereto and is schematically denoted by 11. By contrast, the frame or carrier element 3, on its side facing away from the printed circuit boards 4 to 7, is also designed to be linear such the composite assembly 1 formed by the frame or carrier elements 2 and 3 as well as the printed circuit boards 4 to 7 to be connected thereto has substantially linear outer edges in a transport or processing direction schematically indicated by 12, which will be accordingly beneficial for the subsequent handling of the composite assembly 1, or processing of the printed circuit boards 4 to 7.

In order to reduce any conversion work optionally required in consecutively arranged processing stations or assembly lines, the dimension of the composite assembly 1 can, moreover, be selected to remain substantially constant, in particular normally to the transport direction, even when providing or processing different printed circuit boards.

The printed circuit boards 4 to 7 used in the schematic illustration according to FIG. 1 have different sizes or different dimensions and can, for instance, be formed by printed circuit boards calling for different processing expenditures and/or the use of different processing devices in the context of subsequent processing steps. In this manner, mixed arrays of printed circuit boards 4 to 7 enabling the optimized utilization of, in particular, automated processing devices during subsequent processing steps can be used.

After having been completed or processed, the different printed circuit boards 4 to 7 can additionally or alternatively be integrated in a common component or a common electronic device such that the logistics required for the provision of different printed circuit boards 4 to 7 when assembling such a component or device can be accordingly simplified. When providing a composite assembly comprising a plurality of printed circuit boards including, for instance, all printed circuit boards of a device or component to be produced or assembled, it will thus suffice, for the assemblage of a device, to provide a composite assembly 1 comprising all printed circuit boards 4 to 7 required for that device, while, in known embodiments, such different printed circuit boards have to be provided from a plurality of different formats or production processes involving accordingly increased logistic expenditures.

Such a composite assembly 1 thus, for instance, provides a kit or set of printed circuit boards 4 to 7 to be, for instance, used when assembling a lighting device for a vehicle, comprising a headlamp and a back light.

The different shapes or dimensions of the printed circuit boards 4 to 7 illustrated in FIG. 1 merely constitute a schematic and exemplary illustration such that both the number and the shapes and/or the sizes of the printed circuit boards 4 to 7 to be used for the production of a composite assembly 1 can be selected as a function of the requirements and, in particular, so as to be different from the shapes or sizes and the number illustrated in FIG. 1.

It may, moreover, optionally also suffice to provide but a single frame or carrier element 2 or 3, which is, for instance, disposed along a side edge of the composite assembly 1, that corresponds to the transport direction 12 for handling the composite assembly 1.

In a manner deviating from the illustration according to FIG. 1, it may, moreover, be provided that, in particular normally to the transport direction, adjacently arranged printed circuit boards are connected to each other and only on their outer peripheries or edges as are denoted by 9 for the printed circuit board 5 are connected to at least one contiguous frame or carrier element 3.

FIGS. 2 to 7, partially in section, depict different ways to connect contiguously arranged printed circuit boards or a printed circuit board and a contiguous frame or carrier element. For reasons of simplification of the description or nomenclature, the parts illustrated in FIGS. 2 to 7 and to be mutually connected will partially be generally referred to as elements. Such an element can be comprised of a printed circuit board or a frame or carrier element as indicated above, wherein, in order to further simplify the description, the element each indicated on the right-hand side in the individual illustrations according to FIGS. 2 to 7 constitutes a frame or carrier element, while an element to be connected thereto is to be comprised of a printed circuit board.

Figure 2:
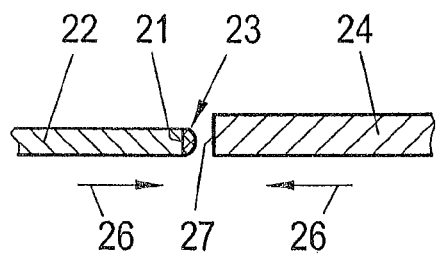

In the embodiment according to FIG. 2, an adhesive 23 is applied to an end side or end face 21 of a printed circuit board 22 by the aid of a dispenser (not illustrated) or a dispensing means (not illustrated). In order to establish a connection, the printed circuit board 22 and the frame or carrier element 24 to be connected thereto are moved towards each other in the sense of arrows 25 and 26 so as to provide a connection in the region of the end faces 21 and 27 via said adhesive 23.

Figure 3:
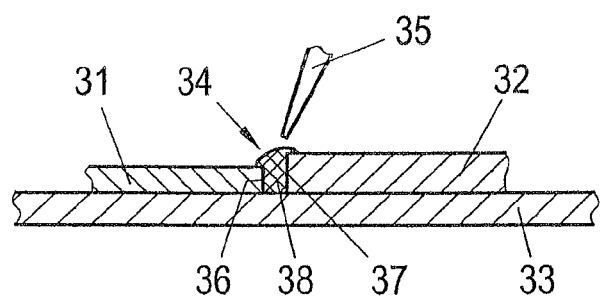

In the modified embodiment illustrated in FIG. 3, both a printed circuit board 31 and a frame or carrier element 32 are placed on a plate or support 33, while an adhesive 34 is introduced into the gap 38 formed between the end faces 36 and 37 by the aid of a dispensing means 35.

Instead of the dispenser or dispensing means 35 for the adhesive, ink-jet printing may, for instance, also be provided to introduce the adhesive 34 into the gap 38.

Figure 4:
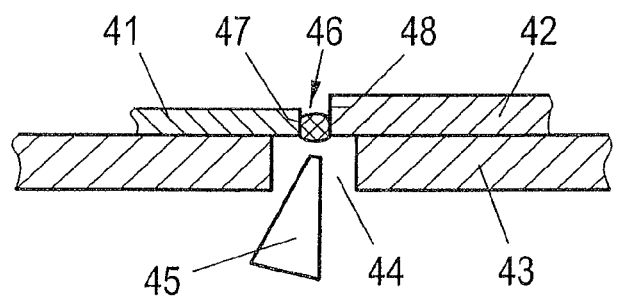

In the embodiment according to FIG. 4, a printed circuit board 41 and a frame or carrier element 42 are again supported on a support device or support plate 43, wherein an opening or gap 44 is provided in the support plate 43 in the region of the elements 41 and 42 to be connected to each other. An adhesive 46 is introduced between the end faces 47 and 48 of the elements 41 and 42 via said gap 44 by the aid of a dispensing means 45 so as to establish a connection between the individual elements.

From the illustrations according to FIGS. 2 to 4 it is apparent that the elements to be connected have, for instance, different thicknesses or vertical extensions or, in general, different structures, e.g. due to different numbers of printed circuit board plies or layers.

Figure 5:
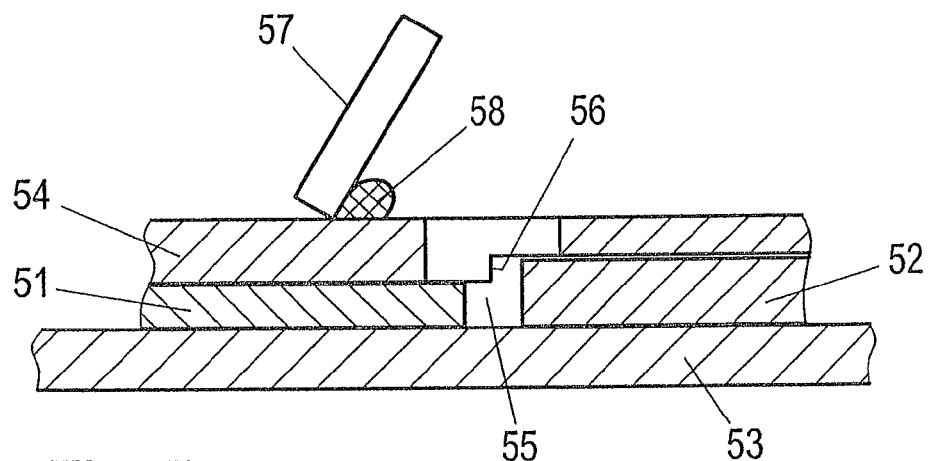
Figure 6:
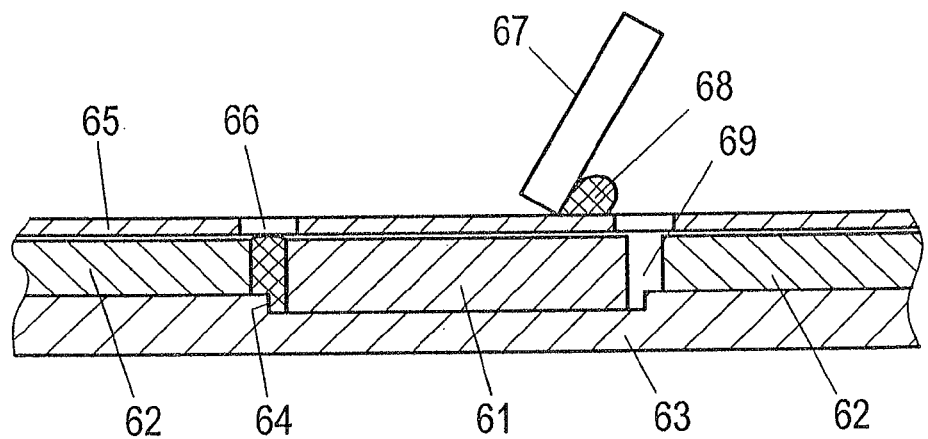

In the embodiments according to FIGS. 5 and 6, the application of an adhesive is each effected by screen-printing, wherein a printed circuit board 51 and a frame or carrier element 52 are supported or placed on a support plate 53 in the configuration according to FIG. 5. Considering the different heights of the elements 51 and 52, a template 54 is used, which is configured to be offset in the region of the gap 55 formed between the elements 51 and 52 and into which the adhesive is to be introduced, as is indicated by step 56. Adhesive 58 is introduced into the gap 55 in the offset region 56 by the aid of a doctor blade 57 to connect the elements 51 and 52.

In order to avoid the use of an offset template 54 as illustrated in FIG. 5, the embodiment according to FIG. 6 uses an appropriately contoured support plate 63 for supporting a printed circuit board 61 and the frame or carrier elements 62 to be connected thereto on both sides, which support plate, as indicated by 64, is designed to be accordingly offset in the region of the printed circuit board 61, which has a large height or thickness. In the embodiment according to FIG. 6, a substantially plane surface of the elements 61 and 62 to be connected to each other is thus provided so as to enable the use of an accordingly simple or standard template 65. Adhesive 68, via passage openings 66, is again introduced into the gap 69 formed between the elements 61 and 62 to be connected, using a doctor blade 67.

Figure 7:
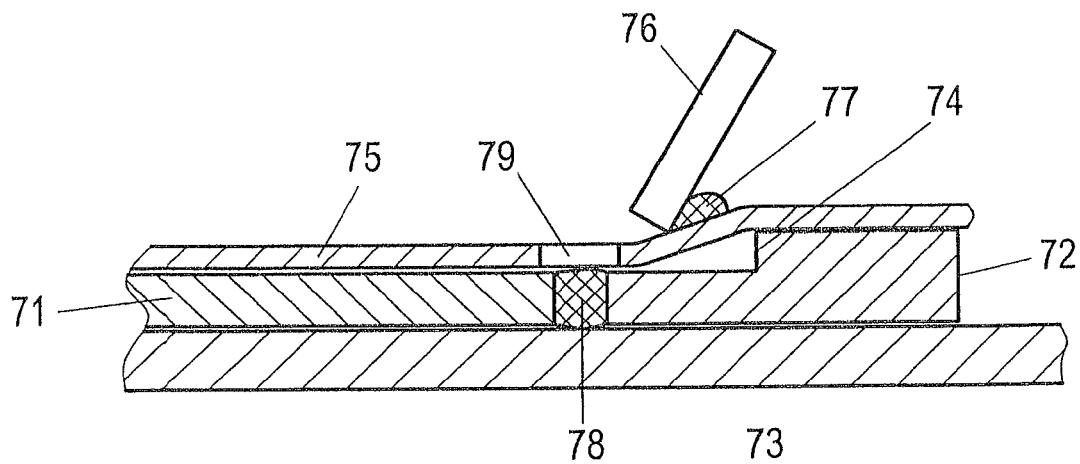

In the further modified embodiment according to FIG. 7, a connection between a printed circuit board 71 and a frame or carrier element 72 is indicated, with both of the elements 71 and 72 being arranged on a plane support plate 73. By configuring the frame or carrier element 72 to comprise an offset region 74 on its upper side for adaptation to a reduced thickness or height of the printed circuit board 71, a standard template 75 may be substantially employed, wherein an adhesive 77, via an interruption or opening 79 in the template 75, is introduced into the gap 78 between the elements 71 and 72 to be connected, again by using a doctor blade 76.

Bearing in mind the usually automated processing and comparatively small dimensions of printed circuit boards connected to frame or carrier elements 2 and 3 to form a composite assembly 1, it is to be anticipated that an elevated number of printed circuit boards 4 to 7 will be used in most cases relative to the illustrated embodiments. The printed circuit boards 4 to 7 combined to a composite assembly 1 are arranged in a spaced-apart relationship in order to enable the proper and separate treatment or processing of the individual printed circuit boards 4 to 7.

In order to enable further cost savings, it may, moreover, be provided that the material of the frame or carrier elements 2, 3, 24, 32, 42, 52, 62 or 72 is usually comprised of a material that is more cost-effective than the material used for the printed circuit boards 4 to 7, 22, 31, 41, 51, 61 or 71 to be connected thereto.

For a further cost reduction, it may, moreover, be provided that the frame or carrier elements 2, 3, 24, 32, 42, 52, 62 or 72 are configured to be reusable.

The invention claimed is:

1. A method for processing or treating a plurality of printed circuit boards, comprising the steps of in the following order:
   providing a plurality of printed circuit boards of different sizes and thicknesses and different constructions,
   providing at least one frame or carrier element for coupling to the plurality of printed circuit boards,
   coupling or connecting the printed circuit boards to the at least one frame or carrier element,
   processing or treating the printed circuit boards in the state coupled to the frame or carrier element,
   wherein the plurality of printed circuit boards are coupled to the at least one frame or carrier element to form a composite assembly, wherein the plurality of printed circuit boards which, after processing, will be assigned to a common structural unit, or integrated or arranged in a common structural unit, are connected or coupled to the at least one frame or carrier element;
   wherein the frame or carrier element has a linear outer peripheral edge facing away from the plurality of printed circuit boards and has an inner peripheral edge facing the plurality of printed circuit boards; wherein the inner peripheral edge has contoured configuration corresponds to different sizes and dimension of the plurality of printed circuit boards for coupling the plurality of printed circuit boards.

2. The method according to claim 1, wherein the configuration or design of the at least one frame or carrier element is selected as a function of the dimensions and/or design of the printed circuit boards to be processed or treated, in order to provide a composite assembly having substantially linear outer edges.

3. The method according to claim 1, wherein the external dimension of the composite assembly is selected to be constant in a direction normal to a transport direction of the printed circuit boards to be processed or treated.

4. The method according to claim 1, wherein the frame or carrier element is each provided on mutually opposite peripheral or edge regions of the composite assembly for coupling or connecting to the plurality of printed circuit boards.

5. The method according to claim 1, wherein coupling or connecting of the printed circuit boards to the at least one frame or carrier element is each effected by using at least one coupling element of a printed circuit board each matching at least one complementary coupling element of the at least one frame or carrier element.

6. The method according to claim 1, wherein the plurality of printed circuit boards are each connected to the at least one frame or carrier element in a mutually spaced-apart relationship.

7. The method according to claim 1, wherein coupling or connecting between the plurality of printed circuit boards and the at least one frame or carrier element is performed in an automated manner.

8. The method according to claim 1, wherein coupling or connecting between the plurality of printed circuit boards and the at least one frame or carrier element is performed by gluing mutually facing end faces of the frame or carrier element and the printed circuit board to be connected thereto.

9. The method according to claim 8, wherein the adhesive is applied to at least one end face of at least one element to be connected, and the elements to be connected are subsequently connected by mutual joining or pressing.

10. The method according to claim 8, wherein applying or introducing an adhesive into a gap between end faces of elements to be connected is accomplished using a dispensing means, a doctor blade, or a screen-printing method.

11. The method according to claim 1, wherein that printed circuit boards calling for differently high processing expenditures in the course of subsequent processing operations are coupled or connected to at least one frame or carrier element.

12. A composite assembly for processing or treating a plurality of printed circuit boards, including at least one frame or carrier element and a plurality of printed circuit boards of different sizes and thicknesses and different structures coupled therewith, said composite assembly, in the coupled state of the printed circuit boards, together with the at least one frame or carrier element being capable of being fed to the processing or treating of the printed circuit boards, wherein the printed circuit boards are coupled to the at least one frame or carrier element to form said composite assembly, wherein the printed circuit boards which, after processing, will be assigned to a common structural unit, or integrated or arranged in a common structural unit, are connected or coupled to the at least one frame or carrier element; wherein the frame or carrier element has a linear outer peripheral edge facing away from the plurality of printed circuit boards and has an inner peripheral edge facing the plurality of printed circuit boards; wherein the inner peripheral edge has contoured configuration corresponds to different sizes and dimension of the plurality of printed circuit boards for coupling the plurality of printed circuit boards.

13. The composite assembly according to claim 12, wherein the dimensions of the at least one frame or carrier element are selected as a function of the dimensions and/or design of the printed circuit boards to be processed or treated.

14. The composite assembly according to claim 12, wherein the external dimension of the composite assembly is selected to be constant in a direction normal to a transport direction of the printed circuit boards to be processed or treated.

15. The composite assembly according to claim 12, wherein a frame or carrier element is each provided on mutually opposite peripheral or edge regions of the composite assembly for coupling or connecting to a plurality of printed circuit boards.

16. The composite assembly according to claim 12, wherein the at least one frame or carrier element comprises a plurality of coupling elements that are each capable of being coupled or connected to at least one complementary coupling element of a respective printed circuit board.

17. The composite assembly according to claim 12, wherein a plurality of printed circuit boards are each connected to the at least one frame or carrier element in a mutually spaced-apart relationship.

18. The composite assembly according to claim 12, wherein the at least one frame or carrier element is configured to be reusable.

19. The composite assembly according to claim 12, wherein the at least one frame or carrier element is made of a material that is more cost-effective than the material used for the printed circuit boards.

20. The composite assembly according to claim 12, wherein the printed circuit boards and the at least one frame or carrier element are connectable by gluing.

21. The method according to claim 1 for automated, assembling, mounting of printed circuit boards.

22. The method of using the composite assembly according to claim 12 for automated, assembling, mounting of printed circuit boards.

* * * * *